United States Patent [19]
Weng et al.

[11] Patent Number: 5,621,697
[45] Date of Patent: Apr. 15, 1997

[54] HIGH DENSITY INTEGRATED CIRCUIT WITH BANK SELECT STRUCTURE

[75] Inventors: Wu-An Weng, Hsinchu; Yaou-Dong Wang, Taipei, both of Taiwan

[73] Assignee: Macronix International Co., Ltd., Taiwan

[21] Appl. No.: 493,553

[22] Filed: Jun. 23, 1995

[51] Int. Cl.$^6$ .................................................. G11C 5/06
[52] U.S. Cl. ..................... 365/230.06; 365/63; 365/72; 365/230.03; 365/51
[58] Field of Search ........................... 365/63, 72, 51, 365/230.03, 230.06

[56] References Cited

U.S. PATENT DOCUMENTS

| | | | |
|---|---|---|---|
| 4,990,999 | 2/1991 | Oishi et al. . | |
| 5,117,389 | 5/1992 | Yiu | 365/104 |
| 5,241,497 | 8/1993 | Komarek . | |
| 5,278,089 | 1/1994 | Nakagawara | 437/52 |
| 5,315,541 | 5/1994 | Harari et al. | 365/63 |
| 5,341,337 | 8/1994 | Hotta | 365/204 |
| 5,471,416 | 11/1995 | Azmanov | 365/104 |

*Primary Examiner*—Viet Q. Nguyen
*Attorney, Agent, or Firm*—Wilson Sonsini Goodrich & Rosati

[57] ABSTRACT

A high performance and high density integrated circuit includes interbank bitlines and a bank select structure which improve the vertical pitch of the integrated circuit layout and provide the selective access of data stored in the memory cells. The bank select structures includes bank select transistors which are located and oriented adjacent metal-to-diffusion region contacts such that vertical pitch of the layout is improved, thus promoting a higher density memory array. The bank select transistor is also formed such that conductivity is increased and impedance decreased due to a relatively wide channel width. On the substrate, a plurality of bitlines, including interbank bitlines and intrabank bitlines, and a plurality of wordlines are provided to form memory cells. In bank $BK_N$, each interbank bitline extends into either bank $BK_{N-1}$ or $BK_{N+1}$ adjacent to bank $BK_N$. For the selection of a cell or plurality of cells in bank $BK_N$, bank $BK_N$ is selected first by applying bank select signals $B_N$ and $B_{N+1}$ to bank select lines $BSL_N$ and $BSL_{N+1}$, respectively, which activate respective bank select transistors. The desired column is selected by turning on respective column select transistors which are coupled to the sense amplifiers and readout circuits via column select lines and applying decode voltages to the selected column via the activated bank select transistors. Finally, the desired memory cell or cells within that selected column and bank $BK_N$ is selected with the plurality of left-right bit selector lines.

31 Claims, 6 Drawing Sheets

HIGH DENSITY INTEGRATED CIRCUIT WITH BANK SELECT STRUCTURE

BACKGROUND OF THE INVENTION

1. Field of the Invention

The present invention relates generally to integrated circuits, and more particularly to high density, high performance memory integrated circuits, such as read-only-memory (ROM) or electrically programmable read-only-memory (EPROM).

2. Description of Related Art

With goals toward increased performance and higher density, various integrated circuit design approaches are known for memory devices such as ROM, EPROM, and other types including electrically-erasable programmable read-only-memory (EEPROM) and flash memory.

One advantageous design uses a so-called "flat" cell design approach. For example, flat cell ROM designs are well documented. One example of a ROM implementation using flat cell design is disclosed in U.S. Pat. No. 5,117,389, issued to inventor Tom D. H. Yiu on May 26, 1992, and entitled "Flat-Cell Read-Only-Memory Integrated Circuit." Other flat cell memory devices are shown in U.S. Pat. No. 5,241,497 (issued to James A. Komarek on Aug. 31, 1993 and entitled, "VLSI Memory with Increased Memory Access Speed, Increased Memory Cell Density and Decreased Parasitic Capacitance"), and U.S. Pat. No. 4,990,999 (issued to Motohiro Oishi et al. on Feb. 5, 1991 and entitled, "Semiconductor Memory Device Using High-Density and High-Speed MOS Elements").

Typically, a ROM array is implemented with a plurality of metal-oxide-semiconductor (MOS) transistors, or memory cells, arranged as an array of bitlines and wordlines. A single memory cell stores a bit of data.

Each MOS device or memory cell can be turned on (i.e. allow electrical current to conduct between the source and the drain) by applying a voltage $V_{GS}$ to its gate that is higher than its threshold voltage. If the applied voltage $V_{GS}$ is lower than the threshold voltage, the MOS device is not turned on. To program code in a memory cell in a ROM array during the manufacturing process, various code programming techniques such as ion implantation with masks, are employed. Based on the overall circuitry, ion implantation can either raise or lower the threshold voltage, thus storing either a "0" or "1".

While the flat-cell design approach achieves substantial density and performance, improvements are still desirable. For example, in U.S. Pat. No. 5,241,497 (Komarek), the block or bank select transistors are placed in a location in the substrate that increases the vertical pitch of the integrated circuit layout. Additional metal-to-diffusion region contacts are also provided specifically for the virtual ground connections which take up additional space on the integrated circuit by increasing its vertical pitch.

Additionally, horizontal pitch may also be improved. In U.S. Pat. No. 4,990,999 (Oishi), metal wiring lines are provided over the main diffusion bitlines and metal contacts are provided for each metal wiring line coupling it to the main diffusion lines. Based on the horizontal placement of these metal contacts, cell sizes, and hence the density of the integrated circuit, appear to be somewhat limited.

Accordingly, a need exists in the integrated circuit industry for increasing performance and density of an integrated circuit memory array by effectively utilizing existing resources without complicating the fabrication process. With complex processes, control of critical dimension decreases. Employing a simple fabrication process should result in a higher yield for the integrated circuit.

SUMMARY OF THE INVENTION

The present invention is a high performance, high density integrated circuit memory array with a single bank select structure per bank and interbank bitlines. The structure of the present invention facilitates the fabrication process and thus allowing control of critical dimensions. Interbank bitlines are provided which reduce the number of bank select transistors while permitting the decoding of banks coupled to the interbank bitlines. With the bank select transistors incorporated along the horizontal pitch adjacent to the metal-to-diffusion region contacts, an improvement in the vertical pitch results. A further advantage of the present invention is that the bank select structure and layout enforce the constant path length rule for memory cell accesses.

The present invention can be characterized as an integrated circuit formed on a substrate. One embodiment of the present invention comprises a plurality of banks $BK_N$ of cells, a bank select line and bank select transistor, a plurality of column select lines and column select transistors, and metal-to-diffusion region contacts.

The plurality of banks $BK_N$ of cells arranged in rows and columns include interbank bitlines, intrabank bitlines, and wordlines. The interbank bitlines are formed in the substrate, where each interbank bitline extends into either bank $BK_{N-1}$ or bank $BK_{N+1}$ adjacent to bank $BK_N$. The wordlines are substantially perpendicular to the plurality of interbank bitlines. In one embodiment, the interbank bitlines in bank $BK_N$ alternately extend into the bank $BK_{N-1}$ immediately above and the bank $BK_{N+1}$ immediately below bank $BK_N$. An advantage of the interbank bitlines is that they substantially reduce the number of bank select transistors.

The bank $BK_N$ further includes a flat bank select transistor and bank select line $BSL_N$. The flat bank select transistor has a gate, a source, a drain, and a channel region capable of coupling the interbank bitline to the corresponding metal-to-diffusion region. The source of the bank select transistor is coupled to one of the corresponding metal-to-diffusion regions and the interbank bitline. The drain of the bank select transistor is coupled to one of the corresponding metal-to-diffusion regions and the interbank bitline that is not coupled to the source. The channel region is formed in the substrate between the corresponding metal-to-diffusion region and the interbank bitline and under the respective bank select line $BSL_N$.

The bank select line $BSL_N$ is substantially perpendicular with the plurality of interbank bitlines and integral with the gate of the bank select transistor. In one embodiment, the bank select line $BSL_N$ for bank $BK_N$ is formed substantially over the interbank bitlines extending into bank $BK_{N-1}$.

Another aspect and advantage of the present invention is the channel region of the bank select transistor. The channel region includes a channel width and a channel length, and the gate of the bank select transistor has a size which provides a greater channel width relative to the channel length to increase conductivity and decrease impedance of the channel region between the source and the drain in the flat bank select transistor. The flat bank select transistor is also located adjacent the corresponding metal-to-diffusion region without adding to the vertical pitch of the integrated circuit.

The invention further comprises a bank select signal circuit coupled to the bank select lines $BSL_N$ for supplying bank select signals $B_N$ and $B_{N+1}$ to bank select lines $BSL_N$ and $BSL_{N+1}$, respectively, for selecting bank $BK_N$, in which $BSL_{N+1}$ represents a bank select line in an adjacent bank. The bank select signal circuit activates respective bank select transistors to couple the column select line to the respective interbank bitline via the metal-to-diffusion region contacts.

The plurality of column select lines is used for accessing a column of cells, where each column select line is capable of being coupled to corresponding interbank bitlines via the corresponding metal-to-diffusion regions. In one embodiment, each bank $BK_N$ includes one column between each pair of interbank bitlines. In another embodiment, each bank $BK_N$ includes two columns between each pair of interbank bitlines.

The column select line is coupled to the respective interbank bitline via the metal-to-diffusion region and the bank select transistor, in which the current path lengths between metal-to-diffusion regions for the selection of the column and accessing selected cells are constant. The plurality of column select lines is coupled to the respective sense circuit via respective column select transistors, and the plurality of column select lines is coupled to the respective interbank bitlines via respective bank select transistors.

The bank $BK_N$ further includes a plurality of left-right bit selector lines substantially parallel with the plurality of wordlines for the selection of one of the memory cells coupled to the corresponding interbank bitlines which are coupled to corresponding column select lines. The selection of the memory cell is accomplished through the application of a bit selector signal to the plurality of left-right bit selector lines. The plurality of left-right bit selector lines includes a first bit selector line and a second bit selector line, and the bit selector signal includes a first bit selector signal and a second bit selector signal. The first bit selector signal applied to the first bit selector line is at a first logic state and the second bit selector signal applied to the second bit selector line is at a second logic state.

The bank $BK_N$ further includes an inverter having an input and an output, wherein the input of the inverter is coupled to the first bit selector line and the output of the inverter is coupled to the second bit selector line for supplying the second bit selector signal.

The cells include control cells and memory cells. The control cells correspond to respective left-right bit selector lines and accessed by the application of respective bit selector signals to respective left-right bit selector lines. The memory cells correspond to respective wordlines and are accessed by the application of respective readout voltages to respective wordlines. Each column in bank $BK_N$ includes a first control cell and a second control cell among the plurality of control cells corresponding to first bit selector line and second bit selector line. The first control cell allows current flow through the first control cell if desired when accessing a memory cell among the plurality of memory cells and the second control cell prevents current flow through the second control cell.

The present invention can also be characterized as a non-volatile memory device formed on a substrate comprising the plurality of banks and the plurality of column select lines. Each $BK_N$ of cells arranged in rows and columns include interbank bitlines, intrabank bitlines, and wordlines. The plurality of interbank bitlines is formed in the substrate and each interbank bitline extends into one of bank $BK_{N-1}$ and bank $BK_{N+1}$ adjacent to bank $BK_N$. The plurality of intrabank bitlines is substantially parallel with the plurality of interbank bitlines that are formed in bank $BK_N$ between the interbank bitlines. The plurality of wordlines is substantially perpendicular to the plurality of interbank bitlines. The plurality of column select lines is used for accessing a column of cells, where each column select line is capable of being coupled to corresponding interbank bitlines. Other elements including the flat bank select transistors and single bank select line per bank which improve the vertical pitch of the layout are as discussed above.

The present invention can also be characterized as a read-only-memory (ROM) fabricated on a substrate comprising the elements discussed above.

With the bank select structure, the present invention can also be characterized as a method of accessing a memory cell in a bank $BK_N$ among a plurality of banks in an integrated circuit memory, where each bank has a bank select line $BSL_N$, wordlines, and interbank bitlines extending into one of bank $BK_{N-1}$ and bank $BK_{N+1}$ adjacent to bank $BK_N$ comprising a sequence of steps including (1) selecting a bank $BK_N$ by decoding banks $BK_N$ and $BK_{N+1}$; (2) selecting a column via column select lines which are coupled to corresponding interbank bitlines; (3) selecting the wordline; (4) selecting the desired memory cell in the column for access by selectively applying bit selector signals to corresponding left-right bit selector lines; and (5) reading data in the selected memory cell via the corresponding column select line.

The step of selecting the bank $BK_N$ further includes activating bank select lines $BSL_N$ and $BSL_{N+1}$ corresponding to banks $BK_N$ and $BK_{N+1}$, respectively, to turn on respective bank select transistors which couple the column select line to the corresponding interbank bitline. The step of selecting the column further includes (1) coupling column select lines to corresponding interbank bitlines; and (2) coupling a voltage source and a voltage reference source to corresponding interbank bitlines via corresponding column select transistors, column select lines, and bank select transistors which are capable of establishing a current path through the selected memory cell.

The step of selecting the desired memory cell further includes (1) applying the first bit select signal to the first bit selector line; and (2) applying the second bit select signal to the second bit selector line, wherein the first bit select signal and the second bit select signal are logically inverse to each other.

BRIEF DESCRIPTION OF THE FIGURES

The above description of the present invention may be better understood with the aid of the following text and accompanying drawings.

DETAILED DESCRIPTION OF PREFERRED EMBODIMENTS

One embodiment of the present invention is an integrated circuit with a bank select structure featuring fully flat cells, improved vertical pitch, higher packing densities, and manufacturability with a simple fabrication process for increased yield, flexibility, and control. Exemplary integrated circuits include various non-volatile memory devices such as EPROMs and read-only-memory (ROM) arrays. As known to those ordinarily skilled in the art, these memory devices include peripheral circuits such as sense amplifiers, X- and Y-decoders, bank decoders, address transition detection latches, input buffers, timing circuitry, chip enable and output enable circuitry, output buffers, and precharge circuitry in addition to the memory cell array.

Figure 1:
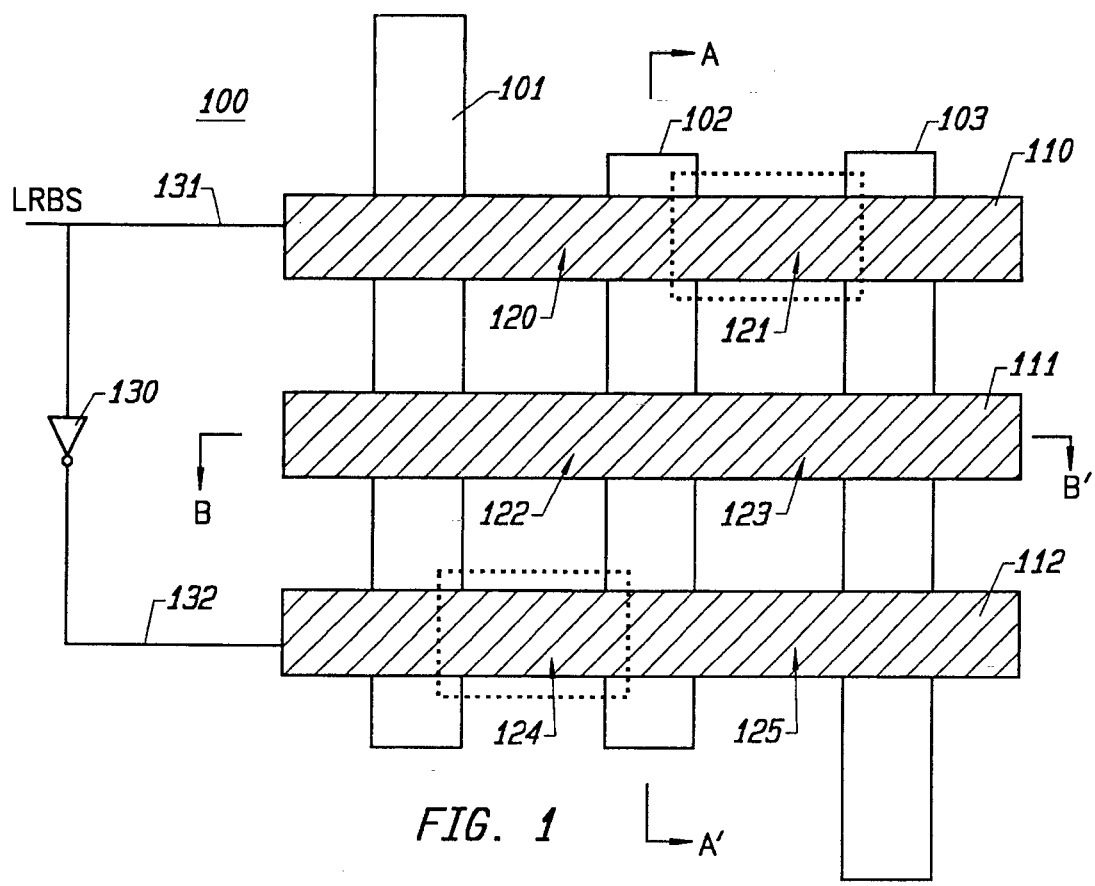
FIG. 1 is a simplified embodiment of the present invention showing the plan view layout of the bitlines, the single wordline, and the left and right bit selectors on a substrate.

A simplified version of an embodiment of the present invention is shown in FIG. 1. FIG. 1 shows a single bank with three bitlines and one wordline. Additional banks can be formed but, for illustrative purposes, a simple single bank structure is shown. On substrate 100, buried diffusion bitlines 101,102, and 103 are formed. In this example, the substrate is P-type and the bitlines are N+ doped diffusion layers. Bitline 101 extends from this bank to a bank located immediately above, if any bank immediately above exists. Bitline 102 is local to this bank and does not extend to other banks. Bitline 103 extends down to another bank, if another bank is formed below this bank. Together, the interbank bitlines 101 and 103 which extend to the banks immediately above and below define a column for this bank. The interbank bitline divides the column into two subcolumns. In this simplified depiction, only a single bank, a single column, and a single wordline are shown for illustrative purposes. These buried diffusion bitlines are formed using known processes.

After the formation of these bitlines, insulator, conductor and photoresist layers are formed. With appropriate masking, conductor structures, such as polysilicon, polycide, or composite layers of metal silicides (e.g., $WSi_2$, $TaSi_2$, or $MoSi_2$) in the form of left-right bit selectors (LRBS) 110 and 112, and wordline 111 are formed in a direction substantially perpendicular to the bitlines which in turn form N-type field-effect transistors (FETs). The source and drain regions of these FETs are formed by the intersection of the bitlines and wordlines. Channel regions are formed in the substrate between the source and drain and under the wordline.

The LRBS and $\overline{LRBS}$ signals are applied to bit selectors 110 and 112 via lines 131 and 132, respectively. The LRBS signal is provided on line 131 to bit selector 110. With an inverter 130 coupled between line 131 and line 132, the $\overline{LRBS}$ signal is provided on line 132 to bit selector 112. Thus, when LRBS is equal to a logic "1" (voltage high), $\overline{LRBS}$ is a logic "0" (voltage low). Hence, when bit selector 110 is energized with a high voltage (logic "1"), those transistors formed with bit selector 110 and storing a logic "1" are turned on, while those transistors formed with bit selector 112 are turned off.

The inverter 130 can be either part of the peripheral circuits or the memory array. In any case, the inverter can be fabricated using known technology. The inverter 130 in FIG. 1 is shown in logic representation; those skilled in the art can provide equivalent transistor and integrated circuit layout representations.

If this bank is selected with the appropriate bank select transistor turned on (not shown in FIG. 1 and to be discussed further below), $V_{DD}$ is applied to bitline 101. Bitline 103 is coupled to ground.

This flat cell Integrated circuit memory array includes control cells 120, 121,124, and 125 and memory cells 122 and 123. In accordance with the present invention, cells 121 and 124 are programmed with logic "0"; that is, code has been programmed into these cells such that the threshold voltage is higher than the bit selector read out voltage and thus, no current flows, in this example. Cells 120 and 125 are programmed with logic "1" to permit current flow, if desired. Memory cells 122 and 123 can be programmed with any code.

The operation of this memory array will now be described. When a given cell is accessed, current will flow from $V_{DD}$ (metal-to-diffusion region contact with bitline 101) to ground (metal-to-diffusion region contact with bitline 103) when the accessed memory cell is programmed with data "1". Current will not flow when the memory cell accessed is programmed with data "0".

To access cell 123, LRBS is equal to logic "1" (bit selector 110 turns on appropriate transistors) and $\overline{LRBS}$ is equal to logic "0" (bit selector 112 turns off appropriate transistors). Thus, this set-up effectively shunts memory cell 122 with control cell 120. When memory cell 123 stores data "1", current flows; if memory cell 123 stores data "0", no current flows. To access memory cell 122, LRBS is set at logic "0" and thus $\overline{LRBS}$ is set at logic "1". This set-up effectively shunts memory cell 123 with control cell 125.

Accordingly, an Integrated circuit memory array in accordance with the present invention is shown where, after the selection of this bank and column, the application of $V_{DD}$, ground, LRBS, and the appropriate read voltage to the wordline will result in the access of the data programmed in a selected memory cell. In FIG. 1, the right memory cell 123 is accessed when LRBS is at a logic "1". The left memory cell 122 is accessed when LRBS is at a logic "0".

Figure 2:
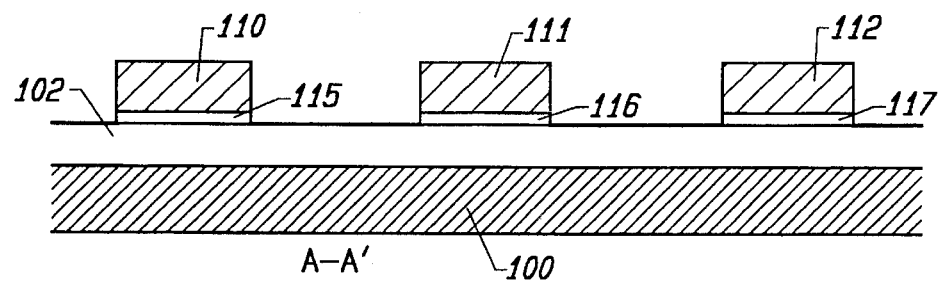
FIG. 2 shows a side view of the ROM array of the present invention along the imaginary reference line A-A' of FIG. 1.

FIG. 2 shows the flat cell Integrated circuit memory array of the present invention. In particular, the layout along imaginary reference line A-A' of FIG. 1 is shown. On substrate 100, buried diffusion bitline 102 is formed. Through a masking step, insulators 115, 116, and 117 are formed along with polysilicon structures 110, 111, and 112. Here, polysilicon structures 110, 112 are used for the left-right bit selectors, whereas polysilicon structure 111 is used for the wordline.

Figure 3:
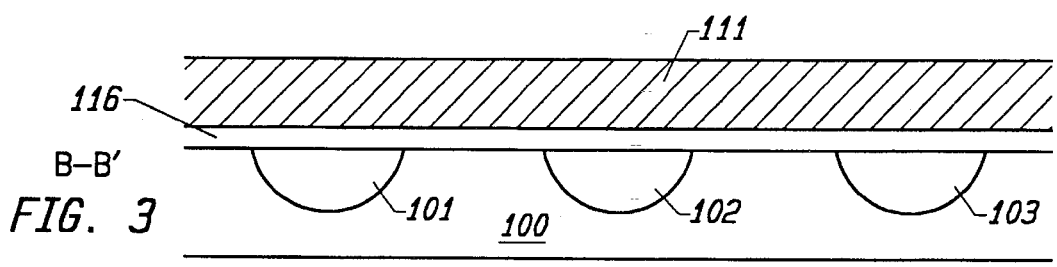
FIG. 3 shows a side view of the ROM array of the present invention along the imaginary reference line B-B' of FIG. 1.

FIG. 3 shows the present invention along imaginary reference line B-B' of the structure of FIG. 1. On substrate 100, buried diffusion bitlines 101, 102, and 103 are formed. Insulator 116 and polysilicon structure 111, used for the wordline, are formed thereon. As evidenced by FIGS. 1, 2, and 3, a fully flat cell Integrated circuit structure processed with simple fabrication techniques is shown.

Figure 4:
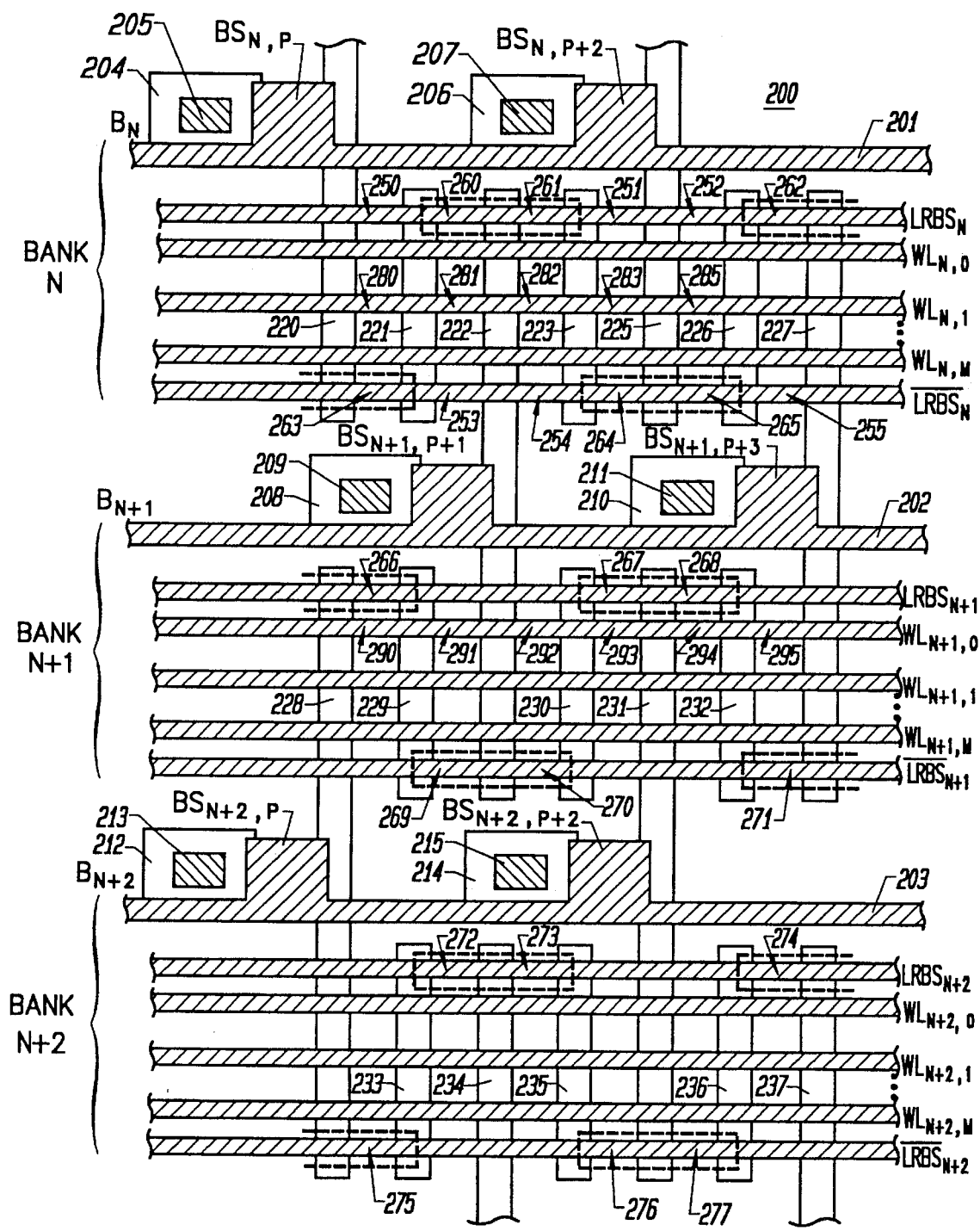
FIG. 4 shows a plan view of a segment of a ROM array in accordance with the present invention showing banks N, N+1, and N+2.

FIG. 4 shows a preferred embodiment of the present invention. In particular, FIG. 4 shows only a portion of a larger Integrated circuit memory array in accordance with the present invention for illustrative purposes. Here, three banks $BK_N$ are shown—bank N, bank N+1, and bank N+2, where N is a positive integer. Each bank includes a plurality of bitlines, in which some of the bitlines are local to that bank and other bitlines extend to neighboring banks, a plurality of wordlines, a plurality of left-right bit selectors (LRBS and $\overline{LRBS}$), a plurality of metal-to-diffusion region contacts, and a plurality of bank select transistors.

In each bank, selected control cells along the LRBS and $\overline{LRBS}$ bank selectors are programmed with a logic "0"

(voltage that is higher than the threshold voltage) for the desired routing of current. Either $V_{DD}$ or ground is applied to the metal-to-diffusion region contacts via column select transistors (or global bitlines). With this Integrated circuit memory array layout, in accordance with the present invention, any selected memory cell in the Integrated circuit memory array can be accessed with the proper selection of the bank select transistor, column select transistor, LRBS and $\overline{\text{LRBS}}$, and the wordline.

As shown in FIG. 4, the following elements are formed on substrate 200. Bank N includes a plurality of bitlines that are local to that bank (intrabank bitlines) and that extend to adjacent banks (interbank bitlines). The intrabank bitlines include bitlines 221, 223, and 226. The interbank bitlines include 220 (formed in banks N and N−1; bank N−1 is not shown in FIG. 4), 222 (formed in banks and N and N+1), 225 (formed in banks N and N−1), and 227 (formed in banks N and N+1). For bank N+1, the intrabank bitlines include bitlines 229, 230, and 232. The interbank bitlines include 228, 222, 231, and 227. For bank N+2, intrabank bitlines include 233, 235, and 236. The interbank bitlines include 228, 234, 231, and 237.

In this embodiment, the interbank bitlines in each bank extend into adjacent banks immediately above and below in alternate fashion. Thus, bank N includes even interbank bitlines 220, 225 that extend into the bank immediately above (bank N−1) and odd interbank bitlines 222, 227 that extend into the bank immediately below (bank N+1). For bank N+1, even interbank bitlines 228, 231 extend into the bank immediately below (bank N+2) and odd interbank bitlines 222, 227 extend into the bank immediately above (bank N). For bank N+2, the even interbank bitlines 228, 231 extend into the bank immediately above (bank N+1) and the odd interbank bitlines 234, 237 extend into the bank immediately below (bank N+3, not shown in FIG. 4).

To form control cells, memory cells, and bank select transistors, polysilicon or other conducting structures are formed on the substrate and the buried diffusion bitlines in a direction perpendicular to the bitlines. Thus, for bank N, the polysilicon structures include wordlines $WL_{N,0}$, $WL_{N,1}$, ..., $WL_{N,M}$, the two left-right bit selectors ($LRBS_N$ and $\overline{LRBS}_N$), and bank select line 201. Hence, M+1 wordlines, two left-right bit selectors, and a single bank select line are provided in bank N.

Analogously, bank N+1 includes wordlines $WL_{N+1,0}$, $WL_{N+1,1}$, ..., $WL_{N+1,M}$, left-right bit selectors ($LRBS_{N+1}$ and $\overline{LRBS}_{N+1}$), and bank select line 202. Also, bank N+2 includes wordlines $WL_{N+2,0}$, $WL_{N+2,1}$, ..., $WL_{N+2,M}$, left-right bit selectors ($LRBS_{N+2}$ and $\overline{LRBS}_{N+2}$), and bank select line 203. Accordingly, memory cells, control cells, and bank select transistors are formed. The left-right bit selector $LRBS_N$ includes a plurality of control cells including 250–252 and 260–262. The $\overline{LRBS}_N$ bit selector includes control cells 253–255 and 263–265. A selected wordline $WL_{N,1}$, for example, includes memory cells 280–285. Similarly, for bank N+1, memory cells 290–295 associated with wordline $WL_{N+1,0}$ are representative. One ordinarily skilled in the art can find other memory cells in this Integrated circuit layout upon further observation.

Although FIG. 4 shows M+1 wordlines per bank, the present invention anticipates varying numbers of wordlines among the banks. Thus, bank N may have M+1 wordlines and bank N+1 may have M+4 wordlines.

Each bank also includes buried diffusion regions with metal-to-diffusion region contact connections and a bank select line for the formation of bank select transistors. Bank N includes buried diffusion regions 204 and 206 with corresponding metal-to-diffusion region contact connections 205 and 207. These metal-to-diffusion region contacts are used for the connection to column select transistors, column select lines, and other peripheral circuits such as sense amplifiers and read-out circuitry 391–394.

Bank select line 201 includes a plurality of bank select transistors such as bank select transistors $BS_{N,P}$ and $BS_{N,P+2}$. Bank N+1 includes buried diffusion regions 208 and 210 with corresponding metal-to-diffusion region contact connections 209 and 211, respectively. Bank select line 202 includes a plurality bank select transistors such as bank select transistors $BS_{N+1,P+1}$ and $BS_{N+1,P+3}$. Bank N+2 includes buried diffusion regions 212 and 214 with corresponding metal-to-diffusion region contact connections 213 and 215. Bank select lines 203 includes a plurality of bank select transistors such as bank select transistors $BS_{N+2,P}$ and $BS_{N+2,P+2}$. For these banks, the bank select transistors can be energized or de-energized with the application of appropriate voltages $B_N$ (for bank N), $B_{N+1}$ (for bank N+1), and $B_{N+2}$ (for bank N+2). Among the advantages of this bank select structure are fully flat cells, improved vertical pitch with only a single bank select line (or a single set of bank select transistors) per bank, and fully decodable along the power and virtual ground column select lines (global bitlines).

With this arrangement, the gates integral with the bank select lines are the buried diffusion regions coupled to the metal contacts are of such a size that the channel region formed in the substrate has increased conductivity and decreased impedance. In accordance with one embodiment of the present invention, the channel width is usually greater than the channel length, hence increasing the current supply for the rest of the memory array.

For the application of a voltage or ground to the column select lines and hence the selected column, sense amplifiers and readout circuit 391–394 are provided coupled to column select transistors $Y_{K-1}$, $Y_K$, $Y_{K+1}$, and $Y_{K+2}$, respectively. $V_{DD}$ and reference voltage $V_{ss}$ (typically ground) are coupled to the sense amplifiers and readout circuits 391–394. When one column select line is coupled to the portion of the circuit that is coupled to $V_{DD}$, the adjacent column select line is coupled to the portion of the circuit coupled to $V_{ss}$. Usually, the non-reference column select line is applied with a voltage less than $V_{DD}$ during decode.

Accordingly, the structure of the present invention improves both the vertical and horizontal pitches of the integrated circuit layout and hence, increasing the density. Vertical pitch improves by constructing and locating bank select transistors horizontally adjacent the metal-to-diffusion region contacts. In the preferred embodiment, the size of the bank select transistor is such that it would not exceed vertical spacing of the metal-to-diffusion region contacts. Usually, a substantial portion of the channel region of the bank select transistor is located horizontally adjacent the metal-to-diffusion region contact so as not to take up much vertical space on the layout.

Horizontal pitch is improved because the metal-to-diffusion region contacts are provided on the layout in a staggered manner. For each bank, metal-to-diffusion region contacts are coupled to every other column select lines. For an adjacent bank, the metal-to-diffusion region contacts are also coupled to every other column select lines that are not coupled to the metal-to-diffusion region contacts of the first bank. Similarly, the metal-to-diffusion region contacts for each bank are coupled to every other interbank bitline. Thus, the metal-to-diffusion region contacts for each interbank bitline (or column select line) are not located adjacent to each other in a horizontal axis or dimension; rather, the metal-to-diffusion region contacts coupled to the interbank bitlines are located above and below each bank as one moves along a horizontal direction. Thus, in FIG. 4, metal-to-diffusion region contact 205 coupled to interbank bitline 220 is located in bank N. Metal-to-diffusion region contact 209 coupled to the adjacent interbank bitline 222 is located below in bank N+1. Metal-to-diffusion region contact 207 coupled to the adjacent interbank bitline 225 is located in bank N. Such a staggered construction allows the layout to be compressed horizontally somewhat which improves the horizontal pitch.

The operation of the Integrated circuit memory array shown in FIG. 4, in accordance with the present invention, will now be described. With respect to bank N, control cells 260–265 are programmed such that a data "0" is stored therein and hence, no current will flow through those control cells. These control cells correspond to the left-right bit selectors $LRBS_N$ and $\overline{LRBS}_N$. The other control cells 250–252 along $LRBS_N$ and 253–255 along $\overline{LRBS}_N$ are programmed with data "1" so that current may flow, if desired. Assuming that a particular memory cell or a plurality of memory cells are desired for access along wordline $WL_{N,1}$, a high voltage signal (logic "1") is applied to wordline $WL_{N,1}$.

To access the data stored in memory cell 285, bank N is selected. Hence, $B_N$ and $B_{N+1}$ are set at logic "1" to turn on bank select transistor $BS_{N,P+2}$. To select the column containing memory cell 285, $V_{DD}$ and ground are applied to metal-to-diffusion region contacts 207 and 211, respectively. Although not shown, $V_{DD}$ is coupled to metal-to-diffusion region contact 207 and buried diffusion region 206. Similarly, metal-to-diffusion region contact 211 and buried diffusion region 210 corresponding to bank N+1 are coupled to ground. Thus, when $B_N$ and $B_{N+1}$ are set at logic "1" (voltage high), bank select transistors $BS_{N,P+2}$ and $BS_{N+1,P+3}$ are turned on. To access the desired memory cell within the column, $LRBS_N$ is set at logic "1" and $\overline{LRBS}_N$ is set at logic "0". With logic "1" applied to wordline $WL_{N,1}$, current will flow if memory cell 285 is stored with data "1". Current will not flow if cell 285 stores data "0". When memory cell 285 is accessed, memory cell 284 is shunted by control cell 252. If memory cell 284 in the same column is desired for access, $LRBS_N$ is applied with a logic "0" and $\overline{LRBS}_N$ is applied with a logic "1". Because memory cell 285 is in the same column, bank, and wordline as memory cell 284, all other parameters remain the same.

Note that to select bank N, both $B_N$ and $B_{N+1}$ must be selected; that is, $B_N$ and $B_{N+1}$ are both at logic "1". To select a column, the appropriate column select transistor is turned on. To select a set of left and right bits or cells in a given column within bank N, the appropriate bank select transistors for banks N and N+1 and column select transistors must be turned on. When turned on, the column select transistors couple $V_{DD}$ and ground to the selected columns in bank N. To select the desired bit or cell within the selected column, the appropriate voltage levels $LRBS_N$ and $\overline{LRBS}_N$ must be applied to the left-right bit selector lines. In this embodiment, the logic level for $\overline{LRBS}_N$ is an inverted version of $LRBS_N$.

To illustrate another example, memory cells 282 and 283 are desired for access. Bank select transistors $BS_{N,P+2}$ and $BS_{N+1,P+1}$ must be selected. Also, $V_{DD}$ must be coupled to buried diffusion region 206 and metal-to-diffusion region contact 207 and ground must be coupled to buried diffusion region 208 and metal-to-diffusion region contact 209 to select the appropriate column. Again, as described above, either the left or right cell can be selected with the appropriate selection of $LRBS_N$ and $\overline{LRBS}_N$. Similarly, to select the column containing cell 280 and 281 in bank N, bank select transistors $BS_{N,P}$ and $BS_{N+1,P+1}$ are turned on. Also, buried diffusion region 204 and metal-to-diffusion region contact 205 are coupled to $V_{DD}$ and buried diffusion region 208 and metal-to-diffusion region contact 209 are coupled to ground. In the above example, memory cells 280–285 corresponding to wordline $WL_{N,1}$ are used to illustrate the operation of the present invention. However, other memory cells corresponding to other wordlines in bank N can also be selected with the appropriate application of voltages to bank selector lines (or bank select transistors) to select the bank, column select transistors coupling either $V_{DD}$ or ground to the appropriate buried diffusion regions and metal-to-diffusion region contacts to select the column, wordlines to select the row, and left-right bit selectors $LRBS_N$ and $\overline{LRBS}_N$ to select the desired memory cell.

As in the discussion above, the same principle applies for the selection of the bank, column, and cell for banks N+1 and N+2. Although not shown in FIG. 4, the Integrated circuit memory array according to the present invention is fully decodable along the column select lines coupled to the metal-to-diffusion region contacts. Thus, one column select line is coupled to metal-to-diffusion region contacts 205 and 213 which in turn are coupled to $V_{DD}$. Another column select line is coupled to metal-to-diffusion region contact 209 which is in turn coupled to ground. A third column select line is coupled to metal-to-diffusion region contacts 207 and 215 which are in turn coupled to $V_{DD}$. Thus, the Integrated circuit memory array is fully decodable along both the power ($V_{DD}$) and virtual ground lines with sense amplifiers and other read-out circuitry that are known to those ordinarily skilled in the art.

The present invention also allows for the access or read out of a plurality of cells, such as either all the "left" cells within each column of a bank or all the "right" cells within each column and wordline of a bank. Thus, when wordline $WL_{N,1}$ is energized with a logic "1", and left-right bit selector $LRBS_N$ is set at logic "1" (and hence $\overline{LRBS}_N$ is set at logic "0"). With all the column select transistors and bank select transistors for bank N activated, memory cells 281, 282, and 285 can be accessed. Alternatively, when bit selector $LRBS_N$ is set at logic "0" (and hence $\overline{LRBS}_N$ is set at logic "1"), cells 280, 283, and 284 can be accessed. This aspect of the invention allows for the simultaneous read-out of a plurality of bits of data (e.g., 16 bits).

This layout also enforces the constant path length rule; resistances between metal-to-diffusion region contacts are constant because the current path distances are the same regardless of the memory cell accessed. Density thus improves because, for all practical purposes, designers need not worry about a shortage of voltage or current supplied to the Integrated circuit memory array.

Figure 5A:
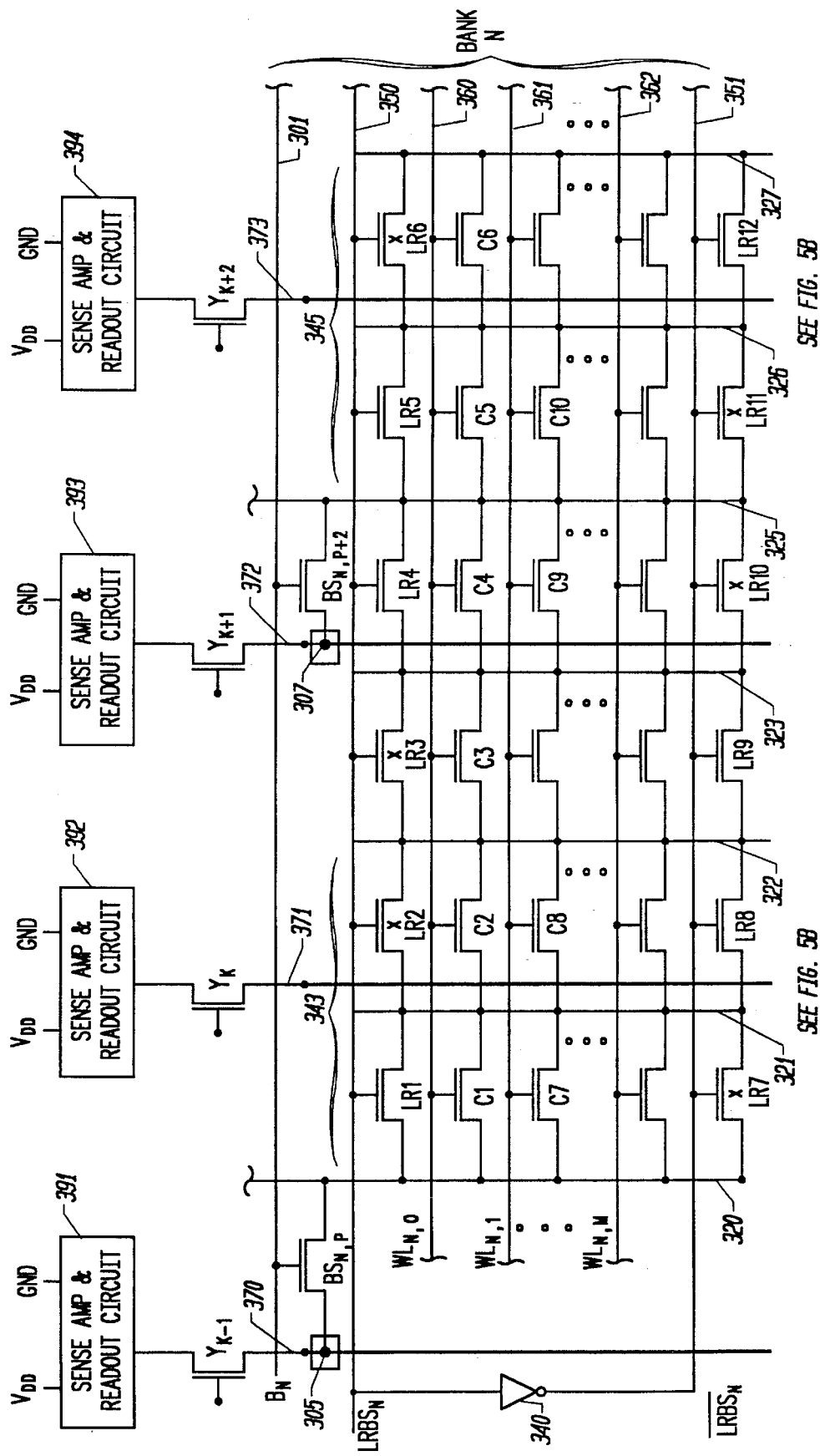
FIG. 5 shows an equivalent circuit diagram of FIG. 4 and other circuit elements in accordance with the present invention.
Figure 5B:
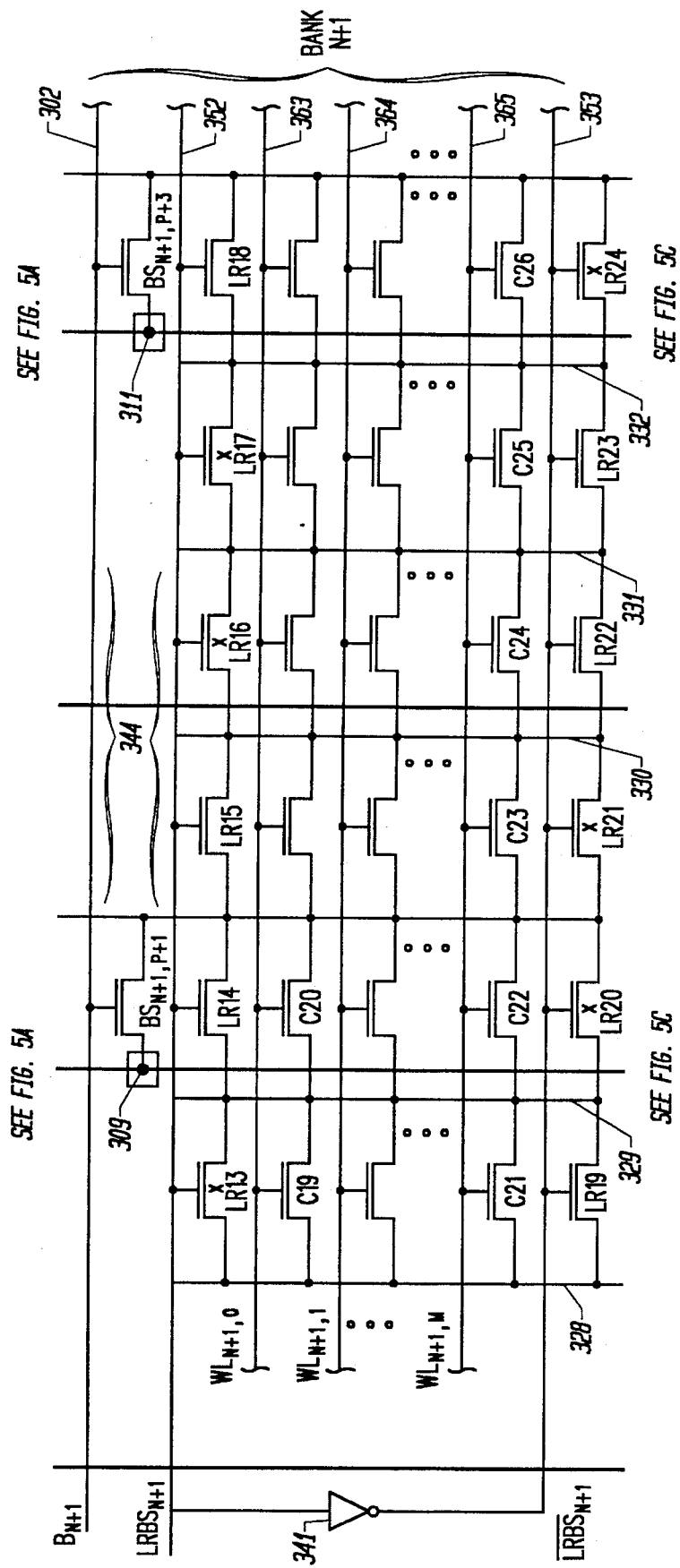
Figure 5C:
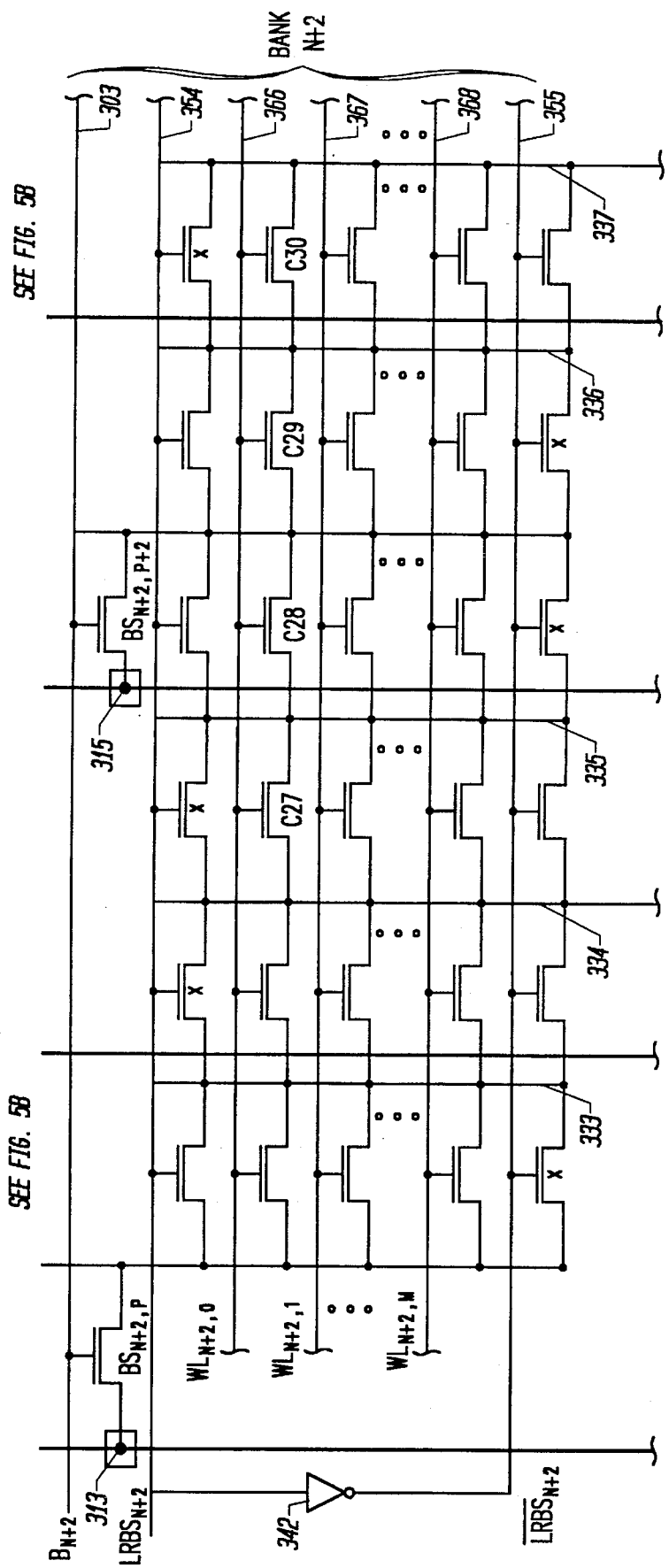

FIG. 5 shows an equivalent circuit diagram for the Integrated circuit memory array of FIG. 4. In addition, FIG. 5 includes other circuit elements that are not shown in FIG. 4 such as the column select transistors and the inverters for the generation for the $\overline{LRBS}$ signal. In this embodiment, the cells, the bank select transistors, and the column select transistors are N type field effect transistors (FET). As in FIG. 4, this equivalent circuit is only a portion of a larger circuit forming the Integrated circuit memory array.

The Integrated circuit memory array comprises a plurality of banks, including bank N, bank N+1 and bank N+2. Each bank further includes a plurality of columns, such as columns 343, 344, and 345. These columns are not only local to a particular bank but they extend between banks. Thus, cells C1 and C2 in bank N and cells C19 and C20 in bank N+1 are part of column 343. Similarly, cells C3 and C4 in bank N and cells C27 and C28 in bank N+2 are part of column 344. Furthermore, cells C25 and C26 in bank N+1 and cells C29 and C30 in bank N+2 are part of column 345.

The equivalent circuit diagram of FIG. 5 shows a plurality of bank selector lines 301, 302, 303. Also, left-right bit selector lines 350–355 are shown parallel to the bank selector lines. Wordlines 360–368 are also formed substantially parallel to the bank selector lines and the left-right bit selector lines.

The lines running perpendicular to the bank selector lines, the left-right bit selector lines, and the wordlines, include the column select lines and the plurality of bitlines. The column select lines 370–373, which are typically metal wires of aluminum, extend among the plurality of banks. The bit lines include interbank bit lines and intrabank bitlines. For bank N, those bitlines that extend between two adjacent banks include interbank bitlines 320, 322, 325, and 327. These interbank bitlines alternately extend into banks immediately above and immediately below. Thus, the even interbank bitlines 320, 325 extend to bank N−1 (not shown in FIG. 5). The odd interbank bitlines 322, 327 extend into bank N+1. Those bitlines that are local to a particular bank and do not extend to neighboring banks include intrabank bitlines 321, 323, and 326 for bank N.

Analogously, bank N+1 includes interbank bitlines 328, 322, 331, and 327. The intrabank bitlines include 329, 330, and 332. Similarly, bank N+2 includes interbank bitlines 328, 334, 331, and 337. Intrabank bitlines include 333, 335, and 336. As discussed with reference to FIGS. 1 and 4, the interbank bitlines represent the column boundaries for the Integrated circuit memory array.

Coupled to these lines include a plurality of column select transistors, bank select transistors, control cells, memory cells, logic gates, and metal-to-diffusion region contacts. Column select transistors $Y_{K-1}$ and $Y_{K+1}$ couple logic "1" voltage $V_{DD}$ to column select lines 370 and 372, respectively. Column select transistors $Y_K$ and $Y_{K+2}$ couple ground to column select lines 371 and 373, respectively. For column select transistors $Y_{K-1}$ and $Y_{K+1}$, the drains are coupled to $V_{DD}$ (and other peripheral circuits such as sense amplifiers and read-out circuitry), the sources are coupled to the column select lines 370, 372, and the gates are connected to the peripheral circuits (not shown in FIG. 5) for the selection of desired columns.

The bank select transistors couple the column select lines to the corresponding interbank bitlines of the various banks. Thus, for bank select transistor $BS_{N,P}$ in bank N, the gate is coupled to bank select line 301, the drain is coupled to column select line 370 via metal-to-diffusion region contact 305, and the source is coupled to interbank bitline 320. For bank select transistor $BS_{N,P+2}$, the gate is coupled to bank select line 301, the drain is coupled to column select line 372 via metal-to-diffusion region contact 307, and the source is coupled to interbank bitline 325. For bank select transistor $BS_{N+1,P+1}$ in bank N+1, the gate is coupled to bank select line 302, the source is coupled to column select line 371 via metal-to-diffusion region contact 309, and the drain is coupled to interbank bitline 322. For bank select transistor $BS_{N+1,P+3}$ in bank N+1, the gate is coupled to bank select line 302, the source is coupled to column select line 373 via metal-to-diffusion region contact 311, and the drain is coupled to interbank bitline 327. For bank select transistor $BS_{N+2,P}$ in bank N+2, the gate is coupled to bank select line 303, the drain is coupled to column select line 370 via metal-to-diffusion region contact 313, and the source is coupled to interbank bitline 328. For bank select transistor $BS_{N+2,P+2}$ in bank N+2, the gate is coupled to bank select line 303, the drain is coupled to column select line 372 via metal-to-diffusion region contact 315, and the source is coupled to interbank bitline 331.

Coupled to the bit selector lines, wordlines, and bitlines, a plurality of control cells and memory cells in the form of N type FETs are provided in the Integrated circuit memory array. Bank N will be used to illustrate the cell configurations. The top row of cells coupled to left-right bit selector line 350 includes control cells for the desired routing of current. Thus, in this embodiment, cells LR1, LR4, and LR5 are programmed with data "1". Cells LR2, LR3, and LR6 are programmed with data "0". In this embodiment, one control cell along the top row in each column stores data "0". The "X" symbol denotes that these cells are always off (data "0").

For control cells LR1 and LR2 in column 343, the gates are coupled to left-right selector line 350, the drains are coupled to interbank bitline 320 and intrabank bitline 321, respectively, and the sources are coupled to intrabank bitline 321 and interbank bitline 322, respectively. For control cells LR3 and LR4 in column 344, the gates are coupled to left-right bit selector line 350, the drains are coupled to intrabank bitline 323 and interbank bitline 325, respectively, and the sources are coupled to interbank bitline 322 and intrabank bitline 323, respectively. For control cells LR5 and LR6 in column 345, the gates are coupled to left-right bit selector line 350, the drains are coupled to interbank bitline 325 and intrabank bitline 326, respectively, and the sources are coupled to intrabank bitline 326 and interbank bitline 327, respectively.

Analogously, the gates of memory cells C1–C6 are coupled to wordline 360. The drain of cell C1 is coupled to interbank bitline 320 and the source is coupled to intrabank bitline 321. For cell C2, the drain is coupled to intrabank bitline 321, and the source is coupled to interbank bitline 322. For cell C3, the source is coupled to interbank bitline 322, and the drain is coupled to intrabank bitline 323. For cell C4, the source is coupled to intrabank bitline 323, and the drain is coupled to interbank bitline 325. For cell C5, the drain is coupled to interbank bitline 325, and the source is coupled to intrabank bitline 326. For cell C6, the drain is coupled to intrabank bitline 326, and the source is coupled to interbank bitline 327. Other cells corresponding to other wordlines in bank N are similarly configured within each column; that is, for example, for column 343, cells C7 and C8 are coupled to wordline 361 at their gates and their sources and drains are coupled to the respective bitlines as in cells C1 and C2. Similarly, cell C9 is configured like cell C4 for column 344 except that the gate of cell C9 is coupled to wordline 361. Also, cell C10 is configured like cell C5 in column 345 except that the gate of cell C10 is coupled to the wordline 361. The control cells LR7–LR12 along the bottom row of bank N are configured like the control cells LR1–LR6 along the top row of bank N, except that the gates of control cells LR7–LR12 are coupled to left-right bit selector line 351. In addition, control cells LR7, LR10 and LR11 are programmed with data "0" and control cells LR8, LR9, and LR 12 are programmed with data "1" for the desired routing of current. The control cells and memory cells in other banks are analogously configured.

For the desired selection of the memory cell in a given column, left-right bit selector lines coupled to the control cells are provided. For bank N, the input of inverter 340 is coupled to left-right bit selector line 350 and the output of inverter 340 is coupled to left-right bit selector line 351. Thus, the logic level applied to left-right bit selector line 350 is the inverse of the logic level applied to left-right bit selector line 351. Similarly, bank N+1 provides inverter 341 coupled between left-right bit selector lines 352 and 353. For bank N+2, inverter 342 is coupled between left-right bit selector lines 354 and 355.

The operation of the bank select structure in accordance with the present invention will now be described. To select a cell or cells in bank N, bank select lines 301 and 302 must be activated with a voltage high enough to establish a logic "1"; that is, $B_N$ and $B_{N+1}$ must be set at logic "1". To select the desired column or columns in bank N, the appropriate column select transistors and bank select transistors must be selected. Thus, selecting column select transistors $Y_{-1}$ and $Y_K$ along with bank select transistors $BS_{N,P}$ and $BS_{N+1,P+1}$ will result in the selection of column 343 in bank N. Analogously, selecting column select transistors $Y_k$ and $Y_{k+1}$ along with bank select transistors $BS_{N,P+2}$ and $BS_{N+1,P+1}$ will result in the selection of column 344 in bank N. Also, the selection of column select transistors $Y_{K+1}$ and $Y_{K+2}$ along with bank select transistors $BS_{N,P+2}$ and $BS_{N+1,P+3}$ will result in the selection of column 345 in bank N. Assuming cell C3 is desired for access, column 344 and wordline 360 must be selected. To select column 344, column select transistors $Y_k$ and $Y_{k+1}$ must be on and bank select transistors $BS_{N,P+2}$ and $BS_{N+1,P+1}$ must be on. These bank select transistors can be turned on when $B_N$ and $B_{N+1}$ are both equal to logic level "1" applied to bank select lines 301 and 302, respectively. Wordline 360 is selected by setting $WL_{N,0}$ equal to logic "1". To select cell C3, $LRBS_N$ is equal to logic level "1" and hence $\overline{LRBS_N}$ is equal to logic level "0". If cell C3 stores logic "1" current will flow through cell C3 between $V_{DD}$ and ground via metal-to-diffusion region contacts 307 and 309. Cell C4 is shunted by control cell LR4. If cell C3 stores logic "0", no current will flow. To select cell C4 in the same column 344, $LRBS_N$ is equal to logic level "0" and $\overline{LRBS_N}$ is equal to logic level "1".

A plurality of memory cells within a wordline can also be read simultaneously. For example, if all of the column select transistors and bank select transistors are turned on, and wordline 360 and left-right bit select line 350 are applied with logic "1", cells C2, C3, and C6 can be accessed. Alternatively, when $LRBS_N$ is equal to logic "0", cells C1, C4, and C5 can be accessed. The same principle applies to cell accesses among the M+1 wordlines in bank N. Because bank N+1 and bank N+2 are configured in a similar manner, the operation of these banks, in accordance with the present invention, is similar to the operation of bank N as described above.

When peripheral circuits transmit cell addresses for accessing particular cells to the Integrated circuit memory array, the present invention provides a bank decoder and a bank select signal generating circuit for generating bank select signals such as $B_N$, $B_{N+1}$, and $B_{N+2}$, to be applied to the bank select lines, such as lines 301, 302, and 303 (see FIG. 5). Because each cell access within a given bank require the activation of the bank select line for that bank and the next adjacent bank select line, a bank select signal generating circuit coupled to the output of the bank decoder is provided.

Figure 6:
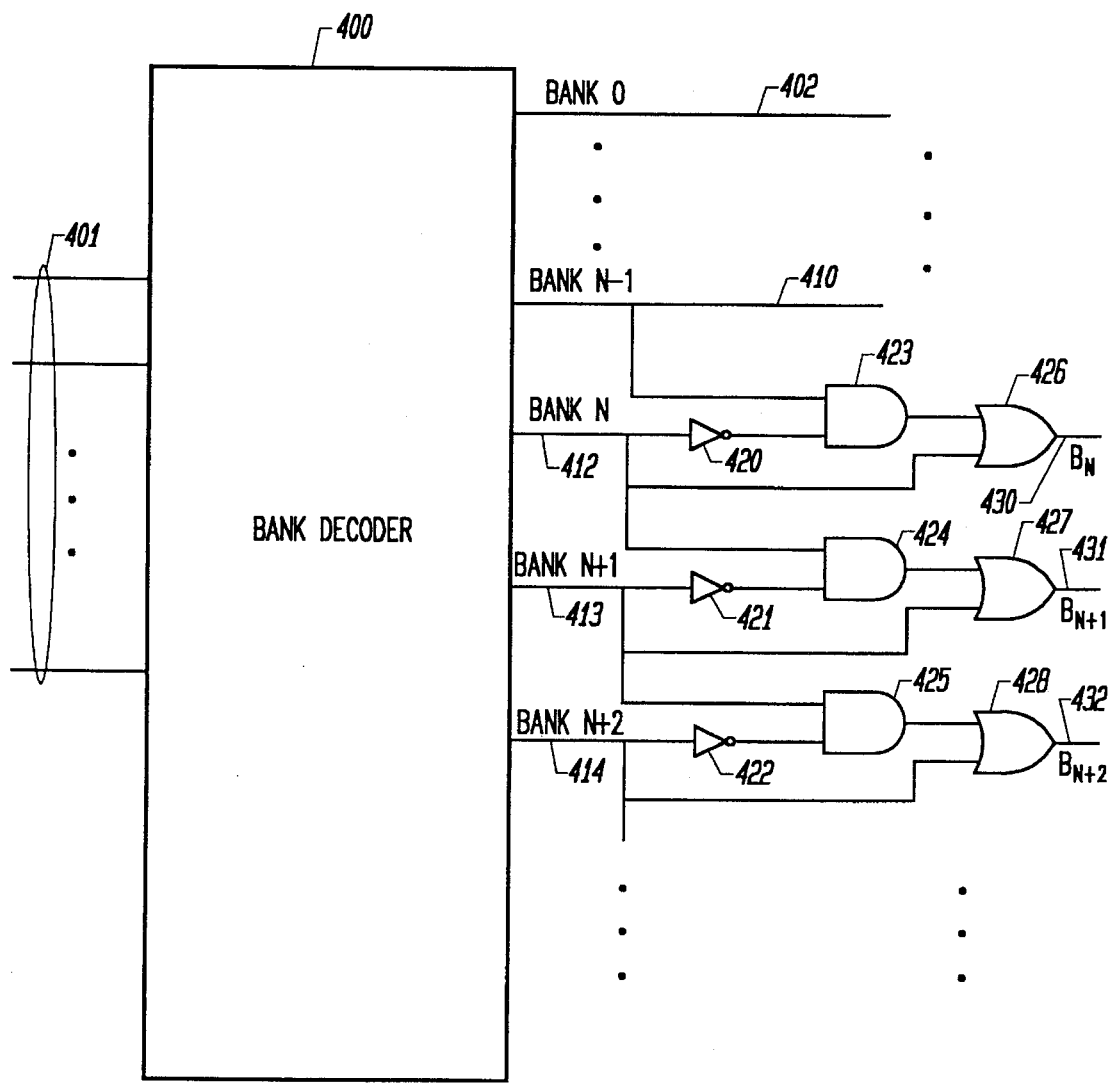
FIG. 6 shows the bank decoder and the bank select signal generating circuit for selecting the desired banks for memory cell access.

FIG. 6 shows the bank decoder 400 and the bank select signal generating circuit coupled to the output of the bank decoder 400. Cell addresses are input at lines 401. The output of the bank decoder 400 includes lines 402, 410, 412, 413, and 414, among others. Each of these output lines corresponds to the selection of bank O (line 402), bank N−1 (line 410), bank N (line 412), bank N+1 (line 413), and bank N+2 (line 414).

In FIG. 6, only a portion of the bank select signal generating circuit is shown due to duplicity and the varying number of banks for the Integrated circuit memory array. Thus, output 410 is coupled to the first input of AND gate 423. Output 412 is coupled to the input of the inverter 420. The output of inverter 420 is coupled to the second input of AND gate 423. The output of AND gate 423 is coupled to the first input of OR gate 426. Output 412 is also coupled to the second input of OR gate 426. The output of OR gate 426 is coupled to line 430 which corresponds to bank select signal $B_N$.

Output 412 is coupled to the first input of AND gate 424. Output 413, which corresponds to bank N+1, is coupled to the input of inverter 421. The output of inverter 421 is coupled to the second input of AND gate 424. The output of AND gate 424 is coupled to the first input of OR gate 427. The output of line 413 is coupled to the second input of OR gate 427. The output of OR gate 427 is line 431 which provides the bank select signal $B_{N+1}$.

Similarly, output 413, which corresponds to the selection of bank N+1, is coupled to the first input of AND gate 425. Output 414, which corresponds to the selection of bank N+2, is coupled to the input of inverter 422. The output of inverter 422 is coupled the second input of AND gate 425. The output of AND gate 425 is coupled to the first input of OR gate 428. Output 414 is also coupled to the second input of OR gate 428. The output of OR gate 428 is line 432 which provides the bank select signal $B_{N+2}$. If more banks are available similar bank select signal generating circuits are provided for this example. Other bank select signal generating circuits are possible for accomplishing the same result.

These outputs 430, 431, and 432 which provide the bank select signals $B_N$, $B_{N+1}$, and $B_{N+2}$, respectively, are coupled to the bank select lines 301, 302, and 303, respectively (see FIG. 5). The following Table 1, entitled "Bank Select Signal Generation", provides a concise summary of the operation of the bank select signal generating circuit of FIG. 6.

TABLE 1

| Bank Select Signal Generation | | | | | | | | | | | |
|---|---|---|---|---|---|---|---|---|---|---|---|
| BK 0 | ... | BK N−1 | BK N | BK N+1 | $B_0$ | $B_1$ | ... | ... | $B_{N-1}$ | $B_N$ | $B_{N+1}$ | $B_{N+2}$ |
| 1 | ... | 0 | 0 | 0 | 1 | 1 | ... | ... | 0 | 0 | 0 | 0 |
| . | ... | . | . | . | . | . | ... | ... | . | . | . | . |
| . | ... | . | . | . | . | . | ... | ... | . | . | . | . |
| . | ... | . | . | . | . | . | ... | ... | . | . | . | . |

TABLE 1-continued

| | | | | Bank Select Signal Generation | | | | | | | |
|---|---|---|---|---|---|---|---|---|---|---|---|
| BK 0 | ... | BK N – 1 | BK N | BK N + 1 | $B_0$ | $B_1$ | ... | ... | $B_{N-1}$ | $B_N$ | $B_{N+1}$ | $B_{N+2}$ |
| . | ... | . | . | . | . | . | ... | ... | . | . | . | . |
| . | ... | . | . | . | . | . | ... | ... | . | . | . | . |
| 0 | ... | 1 | 0 | 0 | 0 | 0 | ... | ... | 1 | 1 | 0 | 0 |
| 0 | ... | 0 | 1 | 0 | 0 | 0 | ... | ... | 0 | 1 | 1 | 0 |
| 0 | ... | 0 | 0 | 1 | 0 | 0 | ... | ... | 0 | 0 | 1 | 1 |

The left side of the table provides those banks that are desired for selection. The right side of the table provides the bank select signals generated in response to the banks desired for selection. Thus, if bank 0 is desired for selection, the bank select signal generating circuit will generate logic level "1" for $B_0$ and $B_1$. All other bank select signals will be at logic level "0". Similarly, if bank N–1 is desired for selection, the bank select signal generating circuit of FIG. 6 provides bank select signals $B_{N-1}$ and $B_N$ at logic level "1". All other bank select signals will be at logic level 0.

In sum, a high performance and high density integrated circuit memory array in accordance with the present invention is described and illustrated. The Integrated circuit layout includes a single bank select structure for each bank and interbank bitlines which improve the vertical pitch and permit memory cell decoding on both the power and virtual ground column select lines (or global bitlines). This Integrated circuit layout is manufacturable using simple fabrication processes which then improves control over critical dimensions.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

We claim:

1. An integrated circuit formed on a substrate, comprising: a plurality of banks $BK_N$ of memory cells arranged in rows and columns, each bank $BK_N$ including, a plurality of interbank bitlines in the substrate, adjacent ones of said plurality of interbank bitlines separated by at least two memory cell columns, and each interbank bitline extending into one of a bank $BK_{N-1}$ immediately above and a bank $BK_{N+1}$ immediately below bank $BK_N$;

an intrabank bitline substantially parallel with and between said adjacent ones of the plurality of interbank bitlines and connecting said at least two of the memory cell columns in bank $BK_N$;

a plurality of wordlines substantially perpendicular to the plurality of interbank bitlines; and a plurality of column select lines for accessing either one of said at least two memory cell columns, each column select line coupled to a one of said plurality of interbank bitlines.

2. The integrated circuit of claim 1, wherein said each column select line coupled to said one of said plurality of interbank bitlines further includes:

means for switchably shorting said adjacent ones of said plurality of interbank bitlines to said intrabank bitline.

3. The integrated circuit of claim 1, wherein the bank $BK_N$ further includes:

a plurality of flat bank select transistors each having a gate, a source, a drain, and a channel region coupling a one of said plurality of interbank bitlines to a one of said plurality of column select lines; and a bank select line $BSL_N$ substantially perpendicular with the plurality of interbank bitlines and integral with the gates of the bank select transistors.

4. The integrated circuit of claim 3, wherein the bank select line bank $BSL_N$ is coupled by said plurality of flat bank select transistors to alternate ones of said column select lines, and bank $BK_{N+1}$ is coupled to those alternate column select lines that are not the column select lines coupled to the metal-to-diffusion region contacts of bank $BK_N$.

5. The integrated circuit of claim 3, wherein the channel region of the bank select transistor has a channel width and a channel length, and the gate of the bank select transistor has a size which provides a greater channel width relative to the channel length to increase conductivity and decrease impedance of the channel region between the source and the drain in the flat bank select transistor.

6. The integrated circuit of claim 3, wherein a substantial portion of the channel region of each of said plurality of the flat bank select transistor is located perpendicular to said plurality of column select lines.

7. The integrated circuit of claim 3, wherein the bank select line $BSL_N$ for bank $BK_N$ is formed substantially over the interbank bitlines extending into bank $BK_{N-1}$.

8. The integrated circuit of claim 3, further comprising:

a bank select signal circuit coupled to the bank select lines $BSL_N$ for supplying bank select signals $B_N$ and $B_{N+1}$ to bank select lines $BSL_N$ and $BSL_{N+1}$, respectively, for selecting bank $BK_N$, in which $BSL_{N+1}$ represent a bank select line in an adjacent bank, which activate respective bank select transistors to couple the column select line to the respective interbank bitline.

9. The integrated circuit of claim 3, wherein the current path length between said adjacent ones of said plurality of interbank bitlines and either one of said at least two memory cell columns is constant.

10. The integrated circuit of claim 9, wherein the plurality of column select lines is coupled to respective sense circuit via respective column select transistors, and the plurality of column select lines is coupled to the respective interbank bitlines via respective bank select transistors.

11. The integrated circuit of claim 2, wherein the means for switchably shorting said adjacent ones of said plurality of interbank bitlines to said intrabank bitline further includes:

at least a pair of left-right bit selector lines substantially parallel with the plurality of wordlines for the selection of a one of said at least two memory cell columns, wherein the selection of said one memory cell column is accomplished through the application of a bit selector signal to said pair of left-right bit selector lines.

12. The integrated circuit of claim 11, wherein the plurality of left-right bit selector lines includes a first bit selector line and a second bit selector line, and the bit selector signal includes a first bit selector signal and a second bit selector signal, the first bit selector signal applied to the first bit selector line is at a first logic state and the second bit selector signal applied to the second bit selector line is at a second logic state.

13. The integrated circuit of claim 12, wherein the bank $BK_N$ further includes an inverter having an input and an output, wherein the input of the inverter is coupled to the first bit selector line and the output of the inverter is coupled to the second bit selector line for supplying the second bit selector signal.

14. The integrated circuit of claim 13, wherein said at least two memory cell columns include control cells and memory cells, the control cells corresponding to respective left-right bit selector lines and accessed by the application of respective bit selector signals to respective left-right bit selector lines, and the memory cells corresponding to respective wordlines and accessed by the application of respective readout voltages to respective wordlines.

15. The integrated circuit of claim 14, wherein each column in bank $BK_N$ includes a first control cell and a second control cell among the plurality of control cells corresponding to first bit selector line and second bit selector line in which the first control cell allows current flow through the first control cell if desired when accessing a memory cell among the plurality of memory cells and the second control cell prevents current flow through the second control cell.

16. A non-volatile memory device formed on a substrate, comprising;
 a plurality of banks $BK_N$ of cells arranged in rows and columns, each bank $BK_N$ including,
  a plurality of interbank bitlines adjacent ones of said plurality of interbank bitlines separated by at least two memory cell columns, and each interbank bitline extending into one of bank $BK_{N-1}$ and bank $BK_{N+1}$ adjacent to bank $BK_N$,
  an intrabank bitline connecting said at least two memory cell columns and substantially parallel with and between said adjacent ones of said plurality of interbank bitlines that are formed in bank $BK_N$;
  a plurality of wordlines substantially perpendicular to the plurality of interbank bitlines; and
  a plurality of column select lines for accessing either one of said at least two memory cell columns, each column select line coupled via a metal-to-diffusion region to one of said plurality of interbank bitlines.

17. The device of claim 16, wherein the bank $BK_N$ further includes:
 a flat bank select transistor having a gate, a source, a drain, and a channel region capable of coupling the interbank bitline among the plurality of interbank bitlines to the corresponding metal-to-diffusion region; and
 a bank select line $BSL_N$ substantially perpendicular with the plurality of interbank bitlines and integral with the gate of the bank select transistor, in which one of the drain and the source of the bank select transistor is coupled to the corresponding metal-to-diffusion region and, the other of the drain and the source of the bank select transistor is coupled to the interbank bitline, and the channel region is formed in the substrate between the corresponding metal-to-diffusion region and the interbank bitline and under the respective bank select line $BSL_N$.

18. The device of claim 17, wherein the bank $BK_N$ includes metal-to-diffusion region contacts that are located along a first horizontal dimension coupled to alternate column select lines and bank $BK_{N+1}$ includes metal-to-diffusion region contacts that are located along a second horizontal dimension coupled to those alternate column select lines that are not the column select lines coupled to the metal-to-diffusion region contacts of bank $BK_N$.

19. The device of claim 17, wherein the channel region of the bank select transistor has a channel width and a channel length, and the gate of the bank select transistor has a size which provides a greater channel width relative to the channel length to increase conductivity and decrease impedance of the channel region between the source and the drain in the flat bank select transistor.

20. The device of claim 17, wherein a substantial portion of the channel region of the flat bank select transistor is located horizontally adjacent the corresponding metal-to-diffusion region contact.

21. The device of claim 17, wherein the bank select line $BSL_N$ for bank $BK_N$ is formed substantially over the interbank bitlines extending into bank $BK_{N-1}$.

22. The device of claim 17, further comprising:
 a bank select signal circuit coupled to the bank select lines $BSL_N$ for supplying bank select signals $B_N$ and $B_{N+1}$ to bank select lines $BSL_N$ and $BSL_{N+1}$, respectively, for selecting bank $BK_N$, in which $BSL_{N+1}$ represent a bank select line in an adjacent bank, which activate respective bank select transistors to couple the column select line to the respective interbank bitline.

23. The device of claim 17, wherein the column select line among the plurality of column select lines is coupled to the respective interbank bitline among the plurality of interbank bitlines via the metal-to-diffusion region and the bank select transistor, and in which the current path lengths between metal-to-diffusion regions for the selection of either one of said at least two memory cell columns are constant.

24. The device of claim 23, wherein the plurality of column select lines are coupled to respective sense circuit via respective column select transistors, and the plurality of column select lines are coupled to the respective interbank bitlines via respective bank select transistors.

25. A non-volatile memory device formed on a substrate, comprising:
 a plurality of banks $BK_N$ of cells arranged in rows and columns, each bank $BK_N$ including,
  a plurality of interbank bitlines, adjacent ones of said plurality of interbank bitlines separated by at least two memory cell columns, and each interbank bitline extending into one of bank $BK_{N-1}$ and bank $BK_{N+1}$ adjacent to bank $BK_N$,
  an intrabank bitline connecting said at least two memory cell columns and substantially parallel with and between said adjacent ones of said plurality of interbank bitlines that are formed in bank $BK_N$;
  a plurality of wordlines substantially perpendicular to the plurality of interbank bitlines;
  a plurality of column select lines for accessing either one of said at least two memory cell columns, each column select line coupled to one of said plurality of interbank bit lines, and;
  at least a pair of left-right bit selector lines substantially parallel with the plurality of wordlines for the selection of a one of said at least two memory cell columns, wherein the selection of said one memory cell column is accomplished through the application of a bit selector signal to said pair of left-right bit selector lines.

26. The device of claim 25, wherein the plurality of left-right bit selector lines includes a first bit selector line and a second bit selector line, and the bit selector signal includes a first bit selector signal and a second bit selector signal, the first bit selector signal applied to the first bit selector line is at a first logic state and the second bit selector signal applied to the second bit selector line is at a second logic state.

27. The device of claim 26, wherein the plurality of memory cell column includes control cells and memory cells, the control cells corresponding to respective left-right bit selector lines and accessed by the application of respective bit selector signals to respective left-right bit selector lines, and the memory cells corresponding to respective wordlines and accessed by the application of respective readout voltages to respective wordlines.

28. The device of claim 27, wherein each column in bank $BK_N$ includes a first control cell and a second control cell among the control cells corresponding to first bit selector line and second bit selector line in which the first control cell allows current flow through the first control cell if desired when accessing a memory cell among the plurality of memory cells and the second control cell prevents current flow through the second control cell.

29. The device of claim 16, wherein the device is a read-only-memory (ROM).

30. A method of accessing a memory cell in a bank $BK_N$ among a plurality of banks in an integrated memory, each bank having a bank select line $BSL_N$, wordlines, and interbank bitlines extending into one of bank $BK_{N-1}$ and bank $BK_{N+1}$ adjacent to bank $BK_N$, comprising steps:

selecting a bank $BK_N$ by decoding banks $BK_N$ and $BK_{N+1}$;

selecting, via two column select lines which are coupled to adjacent interbank bitlines, at least two memory cell columns;

selecting the wordline;

selecting the desired memory cell in the one of said at least two memory cell columns for access by:
 coupling column select lines to corresponding interbank bitlines;

selectively applying bit selector signals to corresponding left-right bit selector lines to couple an intrabank bitline coupling said at least two memory cell columns to a one of said adjacent interbank bitlines, and;

coupling a voltage source and a voltage reference source to said adjacent interbank bitlines via corresponding column select transistors, column select lines, and bank select transistors which are capable of establishing a current path through the selected memory cell; and reading data in the selected memory cell via the corresponding column select line.

31. A method of accessing a memory cell in a bank $BK_N$ among a plurality of banks in an integrated circuit memory; each bank having a bank select line $BSL_N$, wordlines, and interbank bitlines extending into one of bank $BK_{N-1}$ and bank $BK_{N+1}$ adjacent to bank $BK_N$, comprising steps:

selecting a bank $BK_N$ by decoding banks $BK_N$ and $BK_{N+1}$;

selecting, via two column select lines which are coupled to adjacent interbank bitlines, at least two memory cell columns;

selecting the wordline;

selecting the desired memory cell in the one of said at least two memory cell columns for access by selectively applying bit selector signals to corresponding left-right bit selector lines and wherein; said bit selector signals include a first bit select signal and a second bit select signal Which are logically inverse to each other, and wherein the first bit select signal is applied to a left bit selector line; and the second bit select signal is applied to a right bit selector line, to couple an intrabank bitline coupling said at least two memory cell columns to a one of said adjacent interbank bitlines; and reading data in the selected memory cell via the corresponding column select line.

* * * * *